US012813252B2

(12) United States Patent
Cheon et al.

(10) Patent No.: US 12,813,252 B2
(45) Date of Patent: Nov. 24, 2026

(54) PATTERN STRUCTURE AND SEMICONDUCTOR DEVICE INCLUDING THE SAME

(71) Applicant: SAMSUNG ELECTRONICS CO., LTD., Suwon-si (KR)

(72) Inventors: Somin Cheon, Suwon-si (KR); Chulhae Park, Suwon-si (KR); Alexander Schmidt, Suwon-si (KR); Kyungmi Yeom, Suwon-si (KR); Changuk Oh, Suwon-si (KR); Kyungtaek Cho, Suwon-si (KR); Eunsong Jee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 248 days.

(21) Appl. No.: 18/404,203

(22) Filed: Jan. 4, 2024

(65) Prior Publication Data

US 2024/0266284 A1 Aug. 8, 2024

(30) Foreign Application Priority Data

Feb. 6, 2023 (KR) ........................ 10-2023-0015446

(51) Int. Cl.
*H10W 20/43* (2026.01)

(52) U.S. Cl.
CPC .................................. *H10W 20/43* (2026.01)

(58) Field of Classification Search
CPC . H10W 20/43; H10W 20/435; H10W 20/425; H10W 20/48; H10W 42/121
See application file for complete search history.

(56) References Cited

U.S. PATENT DOCUMENTS 10,147,684 B1 12/2018 Kuchanuri et al.
10,192,021 B1 1/2019 Raj et al.
(Continued)

FOREIGN PATENT DOCUMENTS

JP 2010098095 A 4/2010
JP 2014229694 A 12/2014
(Continued)

OTHER PUBLICATIONS

Office Action dated Oct. 21, 2026 issued in corresponding to Korean Patent Application No. 10-2023-0015446.

*Primary Examiner* — Alexander G Ghyka
(74) *Attorney, Agent, or Firm* — Morgan, Lewis & Bockius LLP

(57) ABSTRACT

A pattern structure includes a plurality of first patterns and a plurality of second patterns on a substrate. Each of the plurality of first patterns extend in a first direction and are spaced apart from each other in a second direction, i.e., the first direction and the second direction are substantially parallel to an upper surface of the substrate and perpendicular to each other. Each of the plurality of second patterns extend in the first direction and are spaced apart from each other in the second direction. The plurality of first patterns are aligned with each other in the second direction at a first end, and the plurality of second patterns are aligned with each other in the second direction at a second end that is opposite to the first end in the first direction. The plurality of second patterns are aligned with and spaced apart from the plurality of first patterns, respectively, in the first direction to form a plurality of spaces. Each of the plurality of spaces is located between a first pattern of the plurality of first patterns and a second pattern of the plurality of second patterns that is aligned with the first pattern in the first direction. Additionally, each pair of adjacent spaces from the plurality of
(Continued)

spaces comprises a first space and a second space that is separated from the first space in the first direction.

19 Claims, 13 Drawing Sheets

(56) References Cited

U.S. PATENT DOCUMENTS

| | | | |
|---|---|---|---|
| 10,468,613 | B2 | 11/2019 | Tian et al. |
| 10,490,542 | B2 | 11/2019 | Nelson et al. |
| 10,529,793 | B2 | 1/2020 | Li |
| 10,777,505 | B2 | 9/2020 | Chang et al. |
| 2023/0161937 | A1 | 5/2023 | Cheon et al. |

FOREIGN PATENT DOCUMENTS

| | | | |
|---|---|---|---|
| KR | 1020210042222 | A | 4/2021 |
| KR | 10-2023-0076006 | | 5/2023 |

FIG. 8

| End Space / Pitch | 67/ 85 | 76/ 76 | 87/ 100 | 109.2/ 109.2 | 114/ 114 | 150/ 124 | 180/ 124 | 200/ 124 | 250/ 124 | 300/ 124 | 330/ 124 | 400/ 124 | 450/ 124 | 500/ 124 |
|---|---|---|---|---|---|---|---|---|---|---|---|---|---|---|
| 100 | | | | | | | | | | | | | | |
| 150 | | | | | | | | | | | | | | |
| 200 | | | | | | | | | | | | | | |
| 250 | | | | | | | | | | | | | | |
| 300 | | | | | | | | | | | | | | |
| 350 | | | | | | | | | | | | | | |
| 400 | | | | | | | | | | | | | | |
| 450 | | | | | | | | | | | | | | |
| 500 | | | | | | | | | | | | | | |
| 550 | | | | | | | | | | | | | | |

FIG. 9

| End Space / Pitch | 67/ 85 | 76/ 76 | 87/ 100 | 109.2/ 109.2 | 114/ 114 | 150/ 124 | 180/ 124 | 200/ 124 | 250/ 124 | 300/ 124 | 330/ 124 | 400/ 124 | 450/ 124 | 500/ 124 |
|---|---|---|---|---|---|---|---|---|---|---|---|---|---|---|
| 100 | | | | | | | | | | | | | | |
| 150 | | | | | | | | | | | | | | |
| 200 | | | | | | | | | | | | | | |
| 250 | | | | | | CSR Friendly | | | | | | | | |
| 300 | | | | | | | | | | | | | | |
| 350 | | | | | | | | | | | | | | |
| 400 | | | | | | | | | | | | | | |
| 450 | | | | | | | | | | | | | | |
| 500 | | | | | | | | | | | | | | |
| 550 | | | | | | | | | | | | | | |

PATTERN STRUCTURE AND SEMICONDUCTOR DEVICE INCLUDING THE SAME

CROSS-REFERENCE TO RELATED APPLICATION

This application claims priority under 35 U.S.C. § 119 to Korean Patent Application No. 10-2023-0015446 filed on Feb. 6, 2023 in the Korean Intellectual Property Office, the contents of which are incorporated by reference herein in their entirety.

TECHNICAL FIELD

Embodiments of the present disclosure relate to a pattern structure and a semiconductor device including the same.

DISCUSSION OF RELATED ART

The current electronic technology includes the use of semiconductors for integrated circuits (ICs) that are found in computers, cell-phones, and other electronic devices. Various combination of processes can be used to prepare semiconducting materials for an IC. In some cases, thermal oxidation is performed to form a gate insulator and field oxide. In some cases, a photolithography process creates patterns of circuits on the wafer surface in the IC.

The patterns form the basis of the various components and structures that make up a semiconductor device. Particularly, the photolithography process performs the transfer of patterns into a wafer using light-sensitive chemicals and ultraviolet light. The process enables accurate patterning of the various layers that form the IC (e.g., including the transistors, interconnects, etc.).

A pattern is surrounded by an insulation layer on a substrate and may be formed by creating an opening through the insulation layer. Further, a conductive layer including a metal is deposited in the opening. The process for forming the conductive layer may be performed at a high temperature and as the temperature decreases, a volume of the conductive layer may decrease. Thus, the conductive layer and the surrounding insulation layer may be separated from each other due to the difference between coefficients of thermal expansion of the conductive layer and the insulation layer. Accordingly, a crack may be generated at a boundary between the conductive layer and the insulation layer. Therefore, there is a need in the art for semiconductor devices that have no cracks and hence improved electrical characteristics.

SUMMARY

The present disclosure provides a pattern structure in a semiconductor device having improved characteristics.

According to example embodiments of the present disclosure, there is provided a pattern structure. The pattern structure may include a plurality of first patterns and a plurality of second patterns disposed on a substrate. Each of the plurality of first patterns may extend in a first direction, and may be spaced apart from each other in a second direction, wherein the first direction and the second direction are substantially parallel to an upper surface of the substrate and perpendicular to each other. Each of the plurality of second patterns may extend in the first direction and may be spaced apart from each other in the second direction. The plurality of first patterns may be aligned with each other in the second direction at a first end, and the plurality of second patterns may be aligned with each other in the second direction at a second end that is opposite to the first end in the first direction. The plurality of second patterns may be aligned with and spaced apart from the plurality of first patterns, respectively, in the first direction to form a plurality of spaces. The plurality of spaces may be located between a first pattern of the plurality of first patterns and a second pattern of the plurality of second patterns that is aligned with the first pattern in the first direction. Each pair of adjacent spaces from the plurality of spaces comprises a first space and a second space that is separated from the first space in the first direction.

According to example embodiments of the present disclosure, there is provided a pattern structure. The pattern structure may include a first pattern group and a second pattern group. The first pattern group may include a plurality of first patterns, a plurality of second patterns, and a plurality of third patterns disposed on a substrate and extending in a first direction. The plurality of first patterns, the plurality of second patterns, and the plurality of third patterns may be spaced apart from each other in a second direction, wherein the first direction and the second direction are substantially parallel to an upper surface of the substrate and perpendicular to each other. The second pattern group may include a plurality of fourth patterns, a plurality of fifth patterns, and a plurality of sixth patterns on the substrate, and may extend in the first direction. The plurality of fourth patterns, the plurality of fifth patterns, and the plurality of sixth patterns may be spaced apart from each other in the second direction. The plurality of first patterns, the plurality of second patterns, and the plurality of third patterns may be arranged in the second direction according to an order comprising a pattern of the plurality of first patterns, a pattern of the plurality of second patterns, a pattern of the plurality of third patterns, a subsequent pattern of the plurality of second patterns, and a subsequent pattern of the plurality of first patterns. The plurality of fourth patterns, the plurality of fifth patterns, and the plurality of sixth patterns may be aligned with the plurality of first patterns, the plurality of second patterns, and the plurality of third patterns, respectively, in the first direction. The plurality of fourth patterns, the plurality of fifth patterns, and the plurality of sixth patterns may be arranged in the second direction according to an order comprising a pattern of the plurality of fourth patterns, a pattern of the plurality of fifth patterns, a pattern of the plurality of sixth patterns, a subsequent pattern of the plurality of fifth patterns and a subsequent pattern of the plurality of fourth patterns. A plurality of spaces are located between a first pattern of the plurality of first patterns and a fourth pattern of the plurality of fourth patterns, between a second pattern of the plurality of second patterns and a fifth pattern of the plurality of fifth patterns, and between a third pattern of the plurality of third patterns and a sixth pattern of the plurality of sixth patterns. Each of the adjacent spaces from the plurality of spaces comprises a first space, a second space, and a third space that are separated from each other in the first direction.

According to example embodiments of the inventive concepts, there is provided a semiconductor device. The semiconductor device may include a pattern structure and an insulation layer. The pattern structure may include a plurality of first patterns and a plurality of second patterns disposed on a substrate. Each of the plurality of first patterns may extend in a first direction and may be spaced apart from each other in a second direction, wherein the first and the second directions are substantially parallel to an upper surface of the substrate and perpendicular to each other. Each of the plurality of second patterns may extend in the first direction and may be spaced apart from each other in the second direction. The insulation layer may be formed on the substrate, and may surround the pattern structures. The plurality of second patterns may be aligned with and spaced apart from the plurality of first patterns, respectively, in the first direction to form a plurality of spaces. The insulation layer is disposed between the plurality of first patterns and the plurality of second patterns to form a plurality of first portions, respectively, and the adjacent first portions of the insulation layer comprise a first space and a second space that is separated from the first space in the first direction. Each of the plurality of first patterns and the plurality of second patterns may include a conductive pattern comprising a metal and a barrier pattern surrounding the conductive pattern and comprising a metal nitride. The barrier pattern may have a multi-layered structure of a metal layer comprising a metal and a metal nitride layer comprising a metal nitride. The insulation layer may comprise silicon oxide.

According to the embodiments of the present disclosure, the pattern structure and the insulation layer surrounding the pattern structure do not have cracks and the insulation layer may not be fractured. Thus, the semiconductor device including the pattern structure and the insulation layer may have enhanced electrical characteristics.

BRIEF DESCRIPTION OF THE DRAWINGS

Embodiments of the present disclosure will be more clearly understood from the following detailed description taken in conjunction with the accompanying drawings:

FIG. 8 is a table showing a region (dark region) in which cracks occur and a region (light region) in which no cracks occur in the reference pattern structure having various layouts.

FIG. 9 is a table showing a region (dark region) in which cracks occur and a region (light region) in which no cracks occur in the modified pattern structure having various layouts.

DETAILED DESCRIPTION

Figure 1:
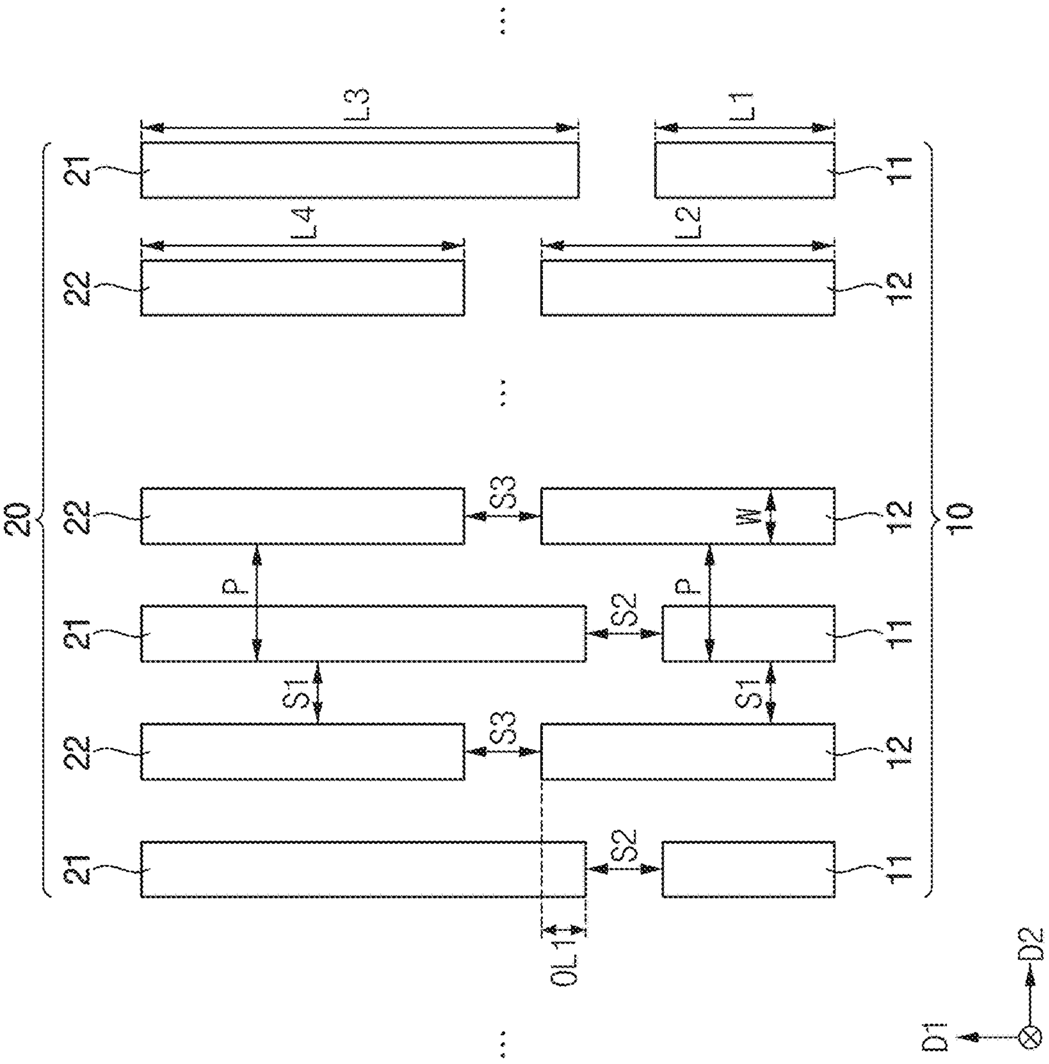
FIGS. 1 to 4 are plan views illustrating layouts of pattern structures in accordance with example embodiments.

Embodiments of the present disclosure include a method for reducing cracks in a semiconductor package. In some cases, embodiments of the present disclosure include a method of testing a crack of a pattern structure including a conductive pattern and an insulation pattern and a method of testing a fracture of the insulation pattern. Additionally, a pattern structure having a high endurance on the crack and/or the fracture may be provided using the crack test method and the fracture test method.

Conventional semiconductor devices include a conductive pattern that is formed at a high temperature. However, as the temperature decreases, the conductive pattern may be separated from an insulation pattern surrounding the conductive pattern due to the difference between the coefficients of thermal expansion of the conductive pattern and the insulation pattern. Additionally, a barrier pattern may be formed between the conductive pattern and the insulation pattern.

In some cases, if the barrier pattern includes a material having a low adhesion to the conductive pattern and the insulation pattern, the separation may not be avoided, and a strain energy may be converted into a kinetic energy by the separation so as to cause a crack at a boundary between the conductive pattern and the insulation pattern. Additionally, if the barrier pattern includes a material having a high adhesion, the separation may be avoided. However, if the strain energy exceeds a limit of fracture of the insulation pattern, the insulation layer may be broken.

Embodiments of the present disclosure include a pattern structure of the semiconductor package that comprises first and second patterns on a substrate. In some cases, the first patterns extend in a first direction and are spaced apart from each other in a second direction, i.e., the first and the second directions are parallel to an upper surface of the substrate and perpendicular to each other. Additionally, the second patterns extend in the first direction and are spaced apart from each other in the second direction.

In some cases, the plurality of first patterns are aligned with each other in the second direction at a first end and the plurality of second patterns are aligned with each other in the second direction at a second end that is opposite to the first end in the first direction. Additionally, the plurality of second patterns are aligned with and spaced apart from the plurality of first patterns, respectively, in the first direction to form a plurality of spaces. In some cases, each of the plurality of spaces is located between a first pattern of the plurality of first patterns and a second pattern of the plurality of second patterns that is aligned with the first pattern in the first direction. Additionally, each pair of adjacent spaces from the plurality of spaces comprises a first space and a second space that is separated from the first space in the first direction.

According to an embodiment, a crack and a fracture of a pattern structure including the conductive pattern and the insulation pattern is tested that enables a pattern structure having a high endurance on the crack and/or the fracture resulting in reduced cracks. Hence, a semiconductor device is created that has no cracks and provides improved electrical characteristics.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. The features described herein may be embodied in different forms and are not to be construed as being limited to the example embodiments described herein. Rather, the example embodiments described herein have been provided merely to illustrate some of the many possible ways of implementing the methods, apparatuses, and/or systems described herein that will be apparent after an understanding of the disclosure of this application.

The present disclosure may be modified in multiple alternate forms, and thus specific embodiments will be exemplified in the drawings and described in detail. In the present specification, when a component (or a region, a layer, a portion, etc.) is referred to as being "on," "connected to," or "coupled to" another component, it means that the component may be directly disposed on/connected to/coupled to the other component, or that a third component may be disposed therebetween.

Like reference numerals may refer to like components throughout the specification and the drawings. It is noted that while the drawings are intended to illustrate actual relative dimensions of a particular embodiment of the specification, the present disclosure is not necessarily limited to the embodiments shown. The term "and/or" includes all combinations of one or more of which associated configurations may define.

The above and other aspects and features of a pattern structure, a semiconductor device including the pattern structure, a method of testing a crack of the pattern structure, and a method of testing a destruction of an insulation layer surrounding the pattern structure in accordance with example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

Additionally, terms such as "below," "under," "on," and "above" may be used to describe the relationship between components illustrated in the figures. The terms are used as a relative concept and are described with reference to the direction indicated in the drawings. It should be understood that the terms "comprise," "include," or "have" are intended to specify the presence of stated features, integers, steps, operations, components, parts, or combinations thereof in the disclosure, but do not preclude the presence or addition of one or more other features, integers, steps, operations, components, parts, or combinations thereof.

Hereinafter, a method for testing a crack of a pattern structure including a conductive pattern and an insulation pattern of an embodiment of the present disclosure will be described in detail with reference to the accompanying drawings. The same reference numerals are used for the same components in the drawings, and duplicate descriptions thereof are omitted.

FIG. 1 is a plan view illustrating a layout of a pattern structure in accordance with embodiments of the present disclosure.

Referring to FIG. 1, the pattern structure may include a first pattern group 10 and a second pattern group 20.

As shown in FIG. 1, the first pattern group 10 may include first and second patterns 11 and 12 and the second pattern group 20 may include third and fourth patterns 21 and 22.

According to some example embodiments, each of the first to fourth patterns 11, 12, 21, and 22 may extend in the first direction D1. Additionally, the first to fourth patterns 11, 12, 21, and 22 may have first to fourth lengths L1, L2, L3, and L4, respectively, in the first direction D1. For example, the second length L2 may be greater than the first length L1 and the third length L3 may be greater than the fourth length L4. The first to fourth patterns 11, 12, 21, and 22 may have a width W in the second direction D2 that crosses the first direction D1.

The first and second patterns 11 and 12 may be spaced apart from each other in the second direction D2 and the third and fourth patterns 21 and 22 may be spaced apart from each other in the second direction D2. In example embodiments, the first and second directions D1 and D2 may be substantially perpendicular to each other. In example embodiments, the first and second patterns 11 and 12 may be spaced apart from each other by a first distance S1 in the second direction D2 and the third and fourth patterns 21 and 22 may be spaced apart from each other by the first distance S1 in the second direction D2.

Thus, a pitch P of the first and second patterns 11 and 12 in the second direction D2 may be substantially equal to a pitch P of the third and fourth patterns 21 and 22 in the second direction D2. Hereinafter, a space between the first and second patterns 11 and 12 and a space between the third and fourth patterns 21 and 22 may be referred to as a first space. That is, the first spaces may have a constant length in the second direction D2.

According to an example embodiment, the first and third patterns 11 and 21 may be aligned with each other in the first direction D1 and may be spaced apart from each other by a second distance S2. According to some embodiments, an alignment indicates a same location in a given direction. Thus, the first and third patterns 11 and 21 may be aligned in the first direction D1 if a line in the first direction D1 is adjacent to (e.g., equally distant from) each of the first and third patterns 11 and 21.

Additionally, the second and fourth patterns 12 and 22 may be aligned with each other in the first direction D1 and may be spaced apart from each other by a third distance S3. That is, end portions of the first and third patterns 11 and 21 facing each other may be spaced apart from each other by the second distance S2 in the first direction D1 and end portions of the second and fourth patterns 12 and 22 facing each other may be spaced apart from each other by the third distance S3 in the first direction D1. Hereinafter, a space between the first and third patterns 11 and 21 may be referred to as a second space and a space between the second and fourth patterns 12 and 22 may be referred to as a third space.

According to some example embodiments, the second and third distances S2 and S3 may be substantially equal to each other. That is, the second spaces and the third spaces may have a constant length in the first direction D1. In some cases, the second and third distances S2 and S3 may be different from each other. In this case, the second spaces may have a constant length in the first direction D1 and the third spaces may have a constant length in the first direction D1, which may be different from the length of the second spaces.

According to some example embodiments, first end portions in the first direction D1 of the first and second patterns 11 and 12 corresponding to each other in the second direction D2 may be aligned with each other in the second direction D2, and first end portions in the first direction D1 of the third and fourth patterns 21 and 22 corresponding to each other in the second direction D2 may be aligned with each other in the second direction D2.

According to some example embodiments, a second end portion in the first direction D1 of the second pattern 12 (i.e., having a relatively large length in the first direction D1 in the first and second patterns 11 and 12) may overlap in the second direction D2 by a first overlap length OL1 with a second end portion in the first direction D1 of the third pattern 21 (i.e., having a relatively large length in the first direction D1 in the third and fourth patterns 21 and 22).

According to some embodiments, a top edge of a pattern of the plurality of first patterns extends above a bottom edge of an adjacent pattern of the plurality of second patterns in the first direction. Thus, as shown in FIG. 1, the top edge of the pattern 12 (that is adjacent to pattern 21) extends above the bottom edge of pattern 21.

According to some example embodiments, the first and second patterns 11 and 12 included in the first pattern group 10 may be alternately and repeatedly disposed in the second direction D2. Similarly, the third and fourth patterns 21 and 22 included in the second pattern group 20 may be alternately and repeatedly disposed in the second direction D2.

Thus, the second space having the second distance S2 between the first and third patterns 11 and 21 aligned with each other in the first direction D1 and the third space having the third distance S3 between the second and fourth patterns 12 and 22 aligned with each other in the first direction D1 may be alternately and repeatedly disposed in the second direction D2. In example embodiments, the second and third spaces may not overlap each other in the second direction D2 and may be arranged in a zigzag pattern in the second direction D2.

Figure 2:
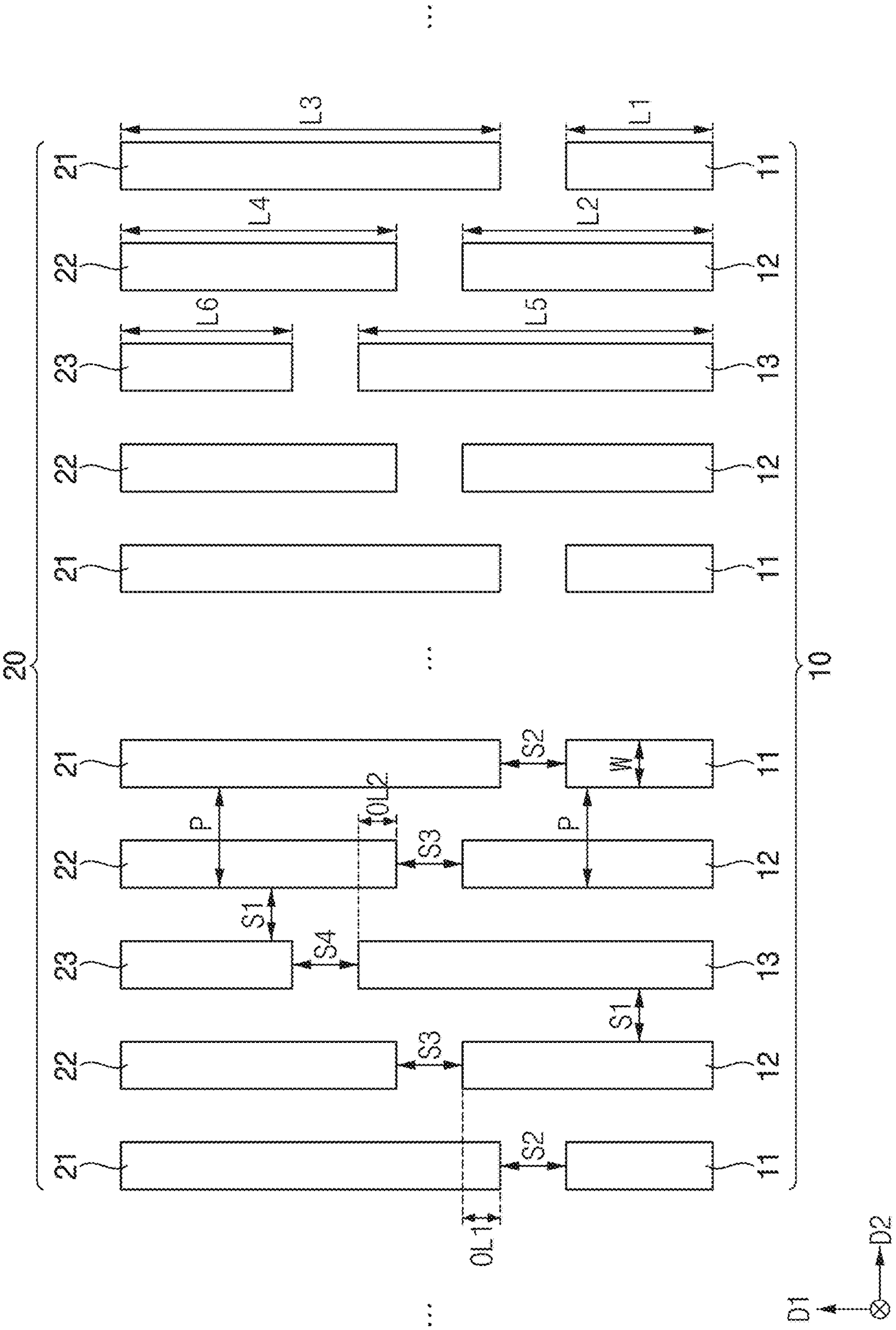
Figure 3:
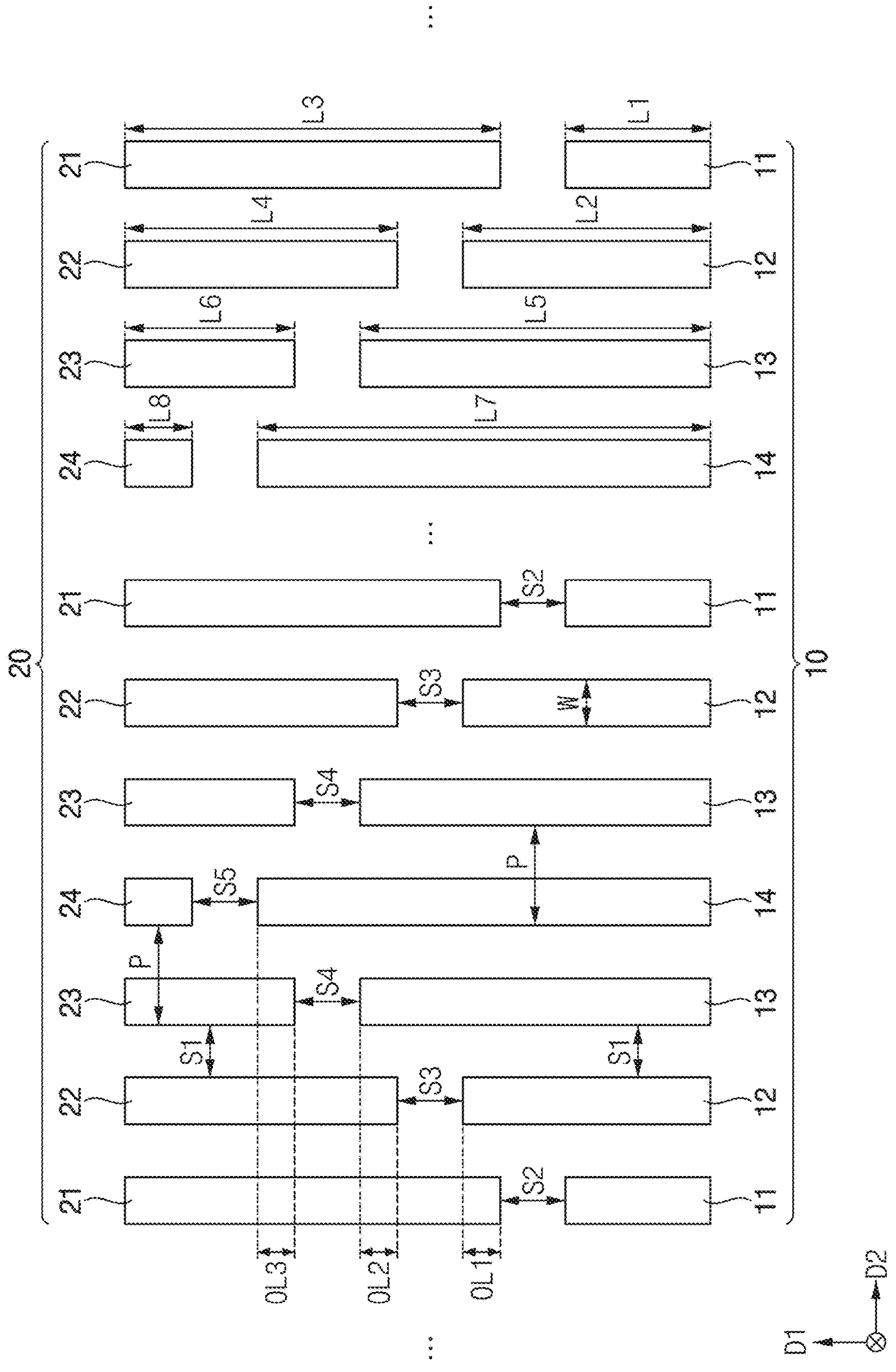
Figure 4:
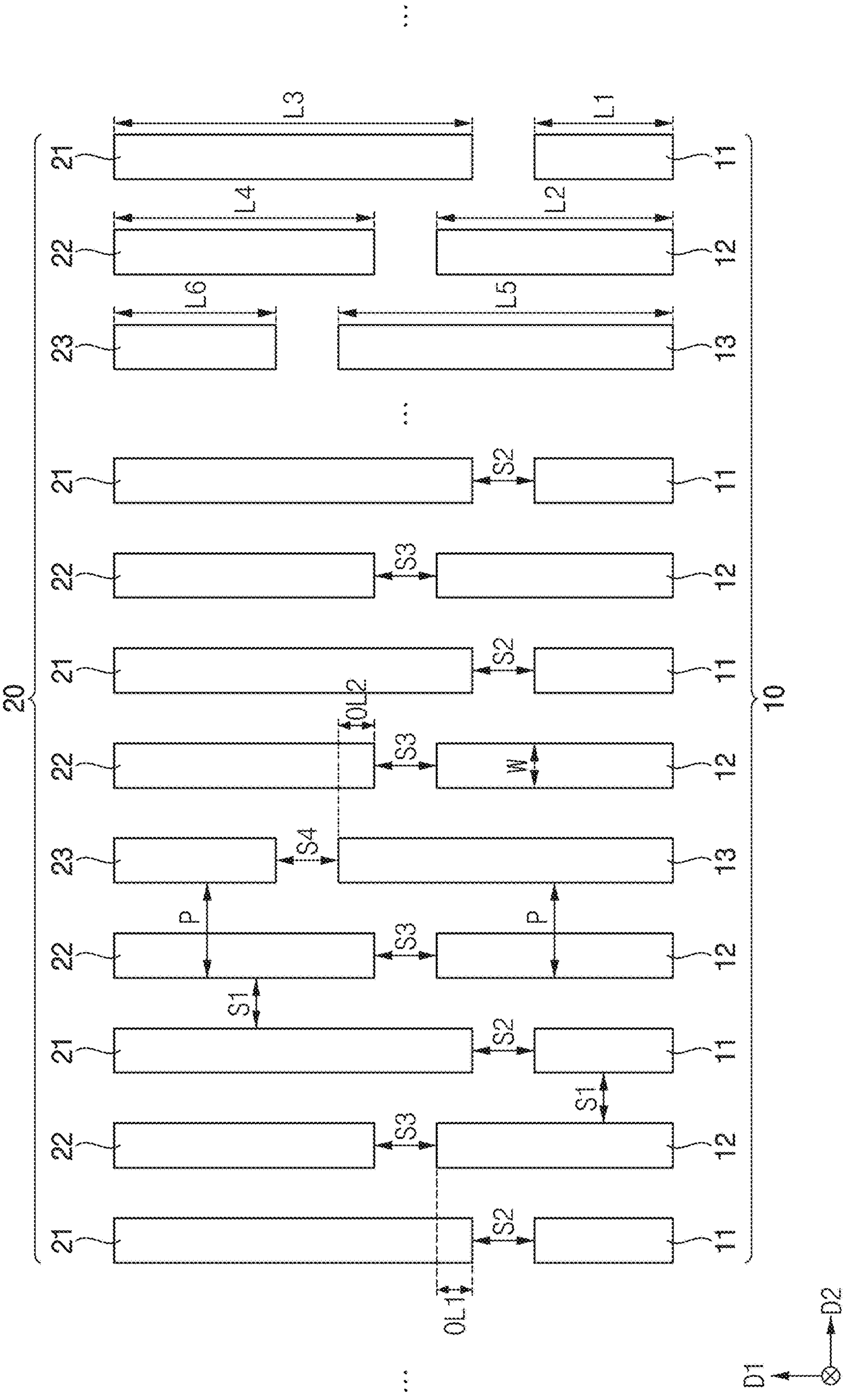

FIGS. 2 to 4 are plan views illustrating layouts of pattern structures in accordance with example embodiments. Each of the layouts of the pattern structures may be substantially the same as or similar to the layout of the pattern structure illustrated with reference to FIG. 1 and hence repeated descriptions are omitted for brevity.

Referring to FIG. 2, the pattern structure may include the first and second pattern groups 10 and 20. As shown in FIG. 2, the first pattern group 10 may include first, second, and fifth patterns 11, 12, and 13. Similarly, the second pattern group 20 may include third, fourth, and sixth patterns 21, 22, and 23.

According to some example embodiments, each of the fifth and sixth patterns 13 and 23 may extend in the first direction D1 and the fifth and sixth patterns 13 and 23 may have fifth and sixth lengths L5 and L6, respectively, in the first direction D1. The fifth length L5 may be greater than the second length L2 and the sixth length L6 may be less than the fourth length L4. The fifth and sixth patterns 13 and 23 may each have the width W in the second direction D2.

Second and fifth patterns 12 and 13 may be spaced apart from each other in the second direction D2, and the fourth and sixth patterns 22 and 23 may be spaced apart from each other in the second direction D2. According to some example embodiments, the second and fifth patterns 12 and 13 may be spaced apart from each other by the first distance S1 in the second direction D2 and the fourth and sixth patterns 22 and 23 may be spaced apart from each other by the first distance S1 in the second direction D2.

Thus, the pitch P of the first, second, and fifth patterns 11, 12 and 13 in the second direction D2 may be substantially equal to the pitch P of the third, fourth, and sixth patterns 21, 22 and 23. Hereinafter, a space between the second and fifth patterns 12 and 13 and a space between the fourth and sixth patterns 22 and 23 may be referred to as the first space.

According to some example embodiments, the fifth and sixth patterns 13 and 23 may 23 may be aligned with each other in the first direction D1 and may be spaced apart from each other by a fourth distance S4. That is, end portions of the fifth and sixth patterns 13 and 23 facing each other may be spaced apart from each other by the fourth distance S4 in the first direction D1. According to some example embodiments, the fourth distance S4 may be substantially equal to the second and third distances S2 and S3. Alternatively, at least one of the second to fourth distances S2, S3, and S4 may be different from other ones of the second to fourth distances S2, S3, and S4.

According to some example embodiments, an end portion in the first direction D1 of the first, second, and fifth patterns 11, 12, and 13 corresponding to each other in the second direction D2 may be aligned with each other in the second direction D2. Additionally, an end portion in the first direction D1 of the third, fourth, and sixth patterns 21, 22, and 23 corresponding to each other in the second direction D2 may be aligned with each other in the second direction D2.

According to some example embodiments, an end portion in the first direction D1 of the fifth pattern 13 (i.e., having a relatively large length in the first direction D1 between the second and fifth patterns 12 and 13) may overlap in the second direction D2 by a second overlap length OL2 with an end portion in the first direction D1 of the fourth pattern 22 (i.e., having a relatively large length in the first direction D1 between the fourth and sixth patterns 22 and 23).

According to some example embodiments, the first, second, and fifth patterns 11, 12, and 13 included in the first pattern group 10 may be arranged in the second direction D2 such as an order of the first pattern 11, the second pattern 12, the fifth pattern 13, the second pattern 12, and then the first pattern 11. Thus, the first, second, and fifth patterns 11, 12, and 13 may 13 may be repeatedly arranged in this order. Additionally, the third, fourth, and sixth patterns 21, 22, and 23 included in the second pattern group 20 may be arranged in the second direction D2 such as an order of the third pattern 21, the fourth pattern 22, the sixth pattern 23, the fourth pattern 22 and then the third pattern 21. Thus, the third, fourth, and sixth patterns 21, 22, and 23 may be repeatedly arranged in this order.

Thus, the second space having the second distance S2 between the first and third patterns 11 and 21 aligned with each other in the first direction D1, the third space having the third distance S3 between the second and fourth patterns 12 and 22 aligned with each other in the first direction D1, and a fourth space having a fourth distance S4 between the fifth and sixth patterns 13 and 23 aligned with each other in the first direction D1 may be arranged in the second direction D2 such as an order of the second space, the third space, the fourth space, the third space and then the second space. Thus, the second to fourth spaces may be repeatedly arranged in this order. According to some example embodiments, the second to fourth spaces may not overlap each other in the second direction D2 and may be arranged in a zigzag pattern in the second direction D2.

Referring to FIG. 3, the pattern structure may include the first and second pattern groups 10 and 20. In some cases, the first pattern group 10 may include first, second, fifth, and seventh patterns 11, 12, 13, and 14. Similarly, the second pattern group 20 may include third, fourth, sixth, and eighth patterns 21, 22, 23, and 24.

According to some example embodiments, each of the seventh and eighth patterns 14 and 24 may extend in the first direction D1 and each of the seventh and eighth patterns 14 and 24 may have seventh and eighth lengths L7 and L8, respectively, in the first direction D1. The seventh length L7 may be greater than the fifth length L5 and the eighth length L8 may be less than the sixth length L6. The seventh and eighth patterns 14 and 24 may have the width W in the second direction D2.

Fifth and seventh patterns 13 and 14 may be spaced apart from each other in the second direction D2 and the sixth and eighth patterns 23 and 24 may be spaced apart from each other in the second direction D2. According to some example embodiments, the fifth and seventh patterns 13 and 14 may be spaced apart from each other by the first distance S1 in the second direction D2 and the sixth and eighth patterns 23 and 24 may be spaced apart from each other by the first distance S1 in the second direction D2.

Thus, the pitch P of the first, second, fifth, and seventh patterns 11, 12, 13, and 14 in the second direction D2 may be substantially equal to the pitch P of the third, fourth, sixth, and eighth patterns 21, 22, 23, and 24. Hereinafter, a space between the fifth and seventh patterns 13 and 14 and a space between the sixth and eighth patterns 23 and 24 may be referred to as the first space.

According to some example embodiments, the seventh and eighth patterns 14 and 24 may be aligned with each other in the first direction D1 and may be spaced apart from each other by a fifth distance S5. That is, end portions of the seventh and eighth patterns 14 and 24 facing each other may be spaced apart from each other by the fifth distance S5 in the first direction D1. According to some example embodiments, the fifth distance S5 may be substantially equal to the second to fourth distances S2, S3, and S4. Alternatively, at least one of the second to fifth distances S2, S3, S4, and S5 may be different from the others of the second to fifth distances S2, S3, S4, and S5.

According to some example embodiments, end portions in the first direction D1 of the first, second, fifth, and seventh patterns 11, 12, 13, and 14 corresponding to each other in the second direction D2 may be aligned with each other in the second direction D2. Additionally, end portions in the first direction D1 of the third, fourth, sixth, and eighth patterns 21, 22, 23, and 24 corresponding to each other in the second direction D2 may be aligned with each other in the second direction D2.

According to some example embodiments, an end portion in the first direction D1 of the seventh pattern 14 (i.e., having a relatively large length in the first direction D1 between the fifth and seventh patterns 13 and 14) may overlap in the second direction D2 by a third overlap length OL3 with an end portion in the first direction D1 of the sixth pattern 23 (i.e., having a relatively large length in the first direction D1 between the sixth and eighth patterns 23 and 24).

According to some example embodiments, the first, second, fifth, and seventh patterns 11, 12, 13, and 14 included in the first pattern group 10 may be arranged in the second direction D2 such that the first pattern 11, the second pattern 12, the fifth pattern 13, the seventh pattern 14, the fifth pattern 13, the second pattern 12, and then the first pattern 11 may be repeatedly arranged in this order. Additionally, the third, fourth, sixth, and eighth patterns 21, 22, 23, and 24 included in the second pattern group 20 may be arranged in the second direction D2 such as an order of the third pattern 21, the fourth pattern 22, the sixth pattern 23, the eight pattern 24, the sixth pattern 23, the fourth pattern 22 and then the third pattern 21 may be repeatedly arranged in this order.

Thus, the second space having the second distance S2 between the first and third patterns 11 and 21 aligned with each other in the first direction D1, the third space having the third distance S3 between the second and fourth patterns 12 and 22 aligned with each other in the first direction D1, the fourth space having the fourth distance S4 between the fifth and sixth patterns 13 and 23 aligned with each other in the first direction D1, and a fifth space having a fifth distance S5 between the seventh and eighth patterns 14 and 24 aligned with each other in the first direction D1 may be arranged in the second direction D2 such that the second space, the third space, the fourth space, the fifth space, the fourth space, the third space and then the second space may be repeatedly arranged in this order. According to some example embodiments, the second to fifth spaces may not overlap each other in the second direction D2 and may be arranged in a zigzag pattern in the second direction D2.

As illustrated with reference to FIGS. 1 to 3, the spaces between the patterns aligned with each other in the first direction D1 may not be aligned with each other in the second direction D2 and may be arranged in a zigzag pattern in the second direction D2. However, the inventive concept may not be limited to the layouts of the FIGS. 1 to 3. For example, one or a plurality of spaces may be further formed to not be aligned with the second to fifth spaces in the second direction D2 in addition to the second to fifth spaces.

In some cases, the second to fifth spaces may not be arranged in the second direction D2 in this order, and the order of arrangement of the second to fifth spaces may be partially changed.

Referring to FIG. 4, the pattern structure may include the first and second pattern groups 10 and 20. In some cases, the first pattern group 10 may include first, second, and fifth patterns 11, 12, and 13. Additionally, the second pattern group 20 may include third, fourth, and sixth patterns 21, 22, and 23.

Thus, the second space between the first and third patterns 11 and 21, the third space between the second and fourth patterns 12 and 22, and the fourth space between the fifth and sixth patterns 13 and 23 may be arranged in the second direction D2 such that the second space, the third space, the second space, the third space, the fourth space, the third space, the second space, the third space and the second space, etc., may be arranged instead of the arrangement illustrated with reference to FIG. 2.

However, the inventive concept may not be limited to the order of arrangement of the second to fourth spaces shown in FIG. 4. In some cases, the second to fourth spaces may be arranged in various orders in the second direction D2. Additionally, the inventive concept may not be limited to the sorts of the second to fourth spaces and more or less spaces may be formed between the patterns.

As illustrated with reference to FIGS. 1 to 4, the pattern structure may include the first and second pattern groups 10 and 20 and the spaces between patterns that may be included in the first and second pattern groups 10 and 20, respectively, and aligned with each other in the first direction D1 may not be aligned with each other in the second direction D2. The spaces may be arranged in various orders in the second direction D2.

That is, the spaces between the patterns that may be included in the first and second pattern groups 10 and 20, respectively, and aligned with each other in the first direction D1 may not be aligned with each other in a line. Additionally, neighboring ones of the spaces may not overlap in the second direction D2.

FIGS. 1 to 4 show that the end portions in the first direction D1 of the first, second, fifth, and seventh patterns 11, 12, 13, and 14 included in the first pattern group 10 are aligned with each other in the second direction D2. Additionally, the end portions in the first direction D1 of the third, fourth, sixth, and eighth patterns 21, 22, 23, and 24 included in the second pattern group 20 are aligned with each other in the second direction D2. However, the inventive concept may not be limited thereto.

In some cases, if two spaces among the second to fifth spaces between the first, second, fifth, and seventh patterns 11, 12, 13, and 14 included in the first pattern group 10 and corresponding spaces of the third, fourth, sixth, and eighth patterns 21, 22, 23, and 24 included in the second pattern group 20, which are neighboring in the second direction D2, do not overlap each other in the second direction D2, the second to fifth spaces may be included in the scope of the inventive concept.

Thus, the spaces that may be disposed between the patterns that may be included in the first and second pattern groups at opposite sides, respectively, in the first direction D1 and aligned with each other in the first direction D1 may not be aligned with each other in the second direction D2 and may be arranged in various patterns, e.g., in a zigzag pattern in the second direction D2. The arrangement of the spaces may be regular or irregular.

Figure 5:
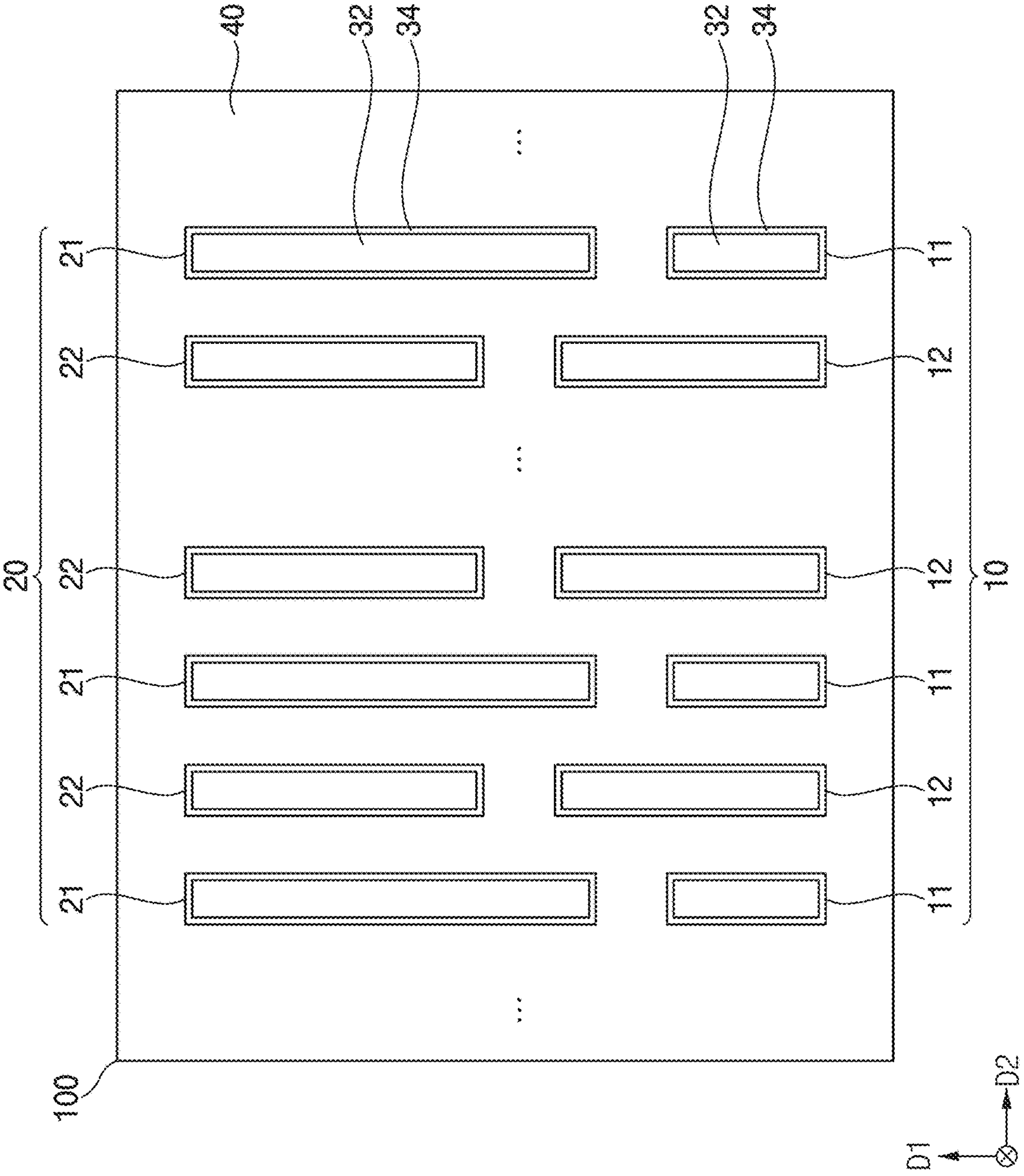
FIG. 5 is a plan view illustrating a pattern structure in accordance with example embodiments.

FIG. 5 is a plan view illustrating a pattern structure in accordance with an example embodiment. The pattern structure may be an implementation of the pattern structure having the layout of FIG. 1, and thus repeated descriptions are omitted herein.

Referring to FIG. 5, the pattern structure may be formed on a substrate 100.

The substrate 100 may include silicon, germanium, silicon-germanium, or a III-V group compound semiconductor, e.g., GaP, GaAs, GaSb, etc. According to some example embodiments, the substrate 100 may be a silicon-on-insulator (SOI) substrate or a germanium-on-insulator (GOI) substrate.

According to some example embodiments, each of the first to fourth patterns 11, 12, 21, and 22 included in the pattern structure may include a conductive pattern 32 and a barrier pattern 34. The barrier pattern 34 may surround a sidewall of the conductive pattern 32. According to an example, the barrier pattern 34 may cover a lower surface of the conductive pattern 32.

According to some examples, the conductive pattern 32 may include a metal, e.g., tungsten, copper, aluminum, etc. and the barrier pattern 34 may include a metal, e.g., titanium, tantalum, etc., and/or a metal nitride, e.g., titanium nitride, tantalum nitride, etc. In some examples, the barrier pattern 34 may include a metal nitride, e.g., tantalum nitride. In some cases, the barrier pattern 34 may have a stacked structure of a metal layer and a metal nitride layer. Alternatively, the barrier pattern 34 may include only a metal nitride layer.

An insulation layer 40 may be formed on the substrate 100 and the insulation layer 40 may surround a sidewall of the pattern structure.

For example, referring to FIG. 5 and FIG. 1 together, the insulation layer 40 may be formed on the substrate 100 and may fill the first space between the first and second patterns 11 and 12 spaced apart from each other by the first distance S1, the first space between the third and fourth patterns 21 and 22 spaced apart from each other by the first distance S1, the second space between the first and third patterns 11 and 21 spaced apart from each other by the second distance S2, and the third space between the second and fourth patterns 12 and 22 spaced apart from each other by the third distance S3. A portion of the insulation layer 40 filling the second space may not overlap a portion of the insulation layer 40 filling the third space in the second direction D2.

In some examples, the insulation layer 40 may include silicon oxide (e.g., tetraethyl orthosilicate (TEOS)), an insulating nitride (e.g., silicon nitride), etc.

The inventive concept may not be limited to the pattern structure having the layout of FIG. 1 and the pattern structure may also have the layouts of FIGS. 2 to 4. The insulation layer 40 may be formed on the substrate 100 and may fill the second to fifth spaces.

According to some example embodiments, the pattern structure and the insulation layer may be a portion of a semiconductor device. That is, any semiconductor device including a plurality of patterns, each of which may have the conductive pattern 32 and the barrier pattern 34, spaced apart from each other and the insulation layer 40 filling spaces between the patterns may be included in the scope of the inventive concept.

In some cases, the insulation layer 40 may be a top supporter of a vertical non-volatile memory device, e.g., a VNAND flash memory device, and the pattern structure may be a conductive structure in a cut line formed in the top supporter.

That is, the top supporter for preventing a mold from collapsing may include an insulation material and the first to fourth patterns 11, 12, 21 and 22 may be formed in the cut lines in the top supporter. The second space between the first and third patterns 11 and 21 and the third space between the second and fourth patterns 12 and 22 may not be aligned with each other in a line in the second direction D2, but may be arranged in a zigzag pattern.

Figure 6:
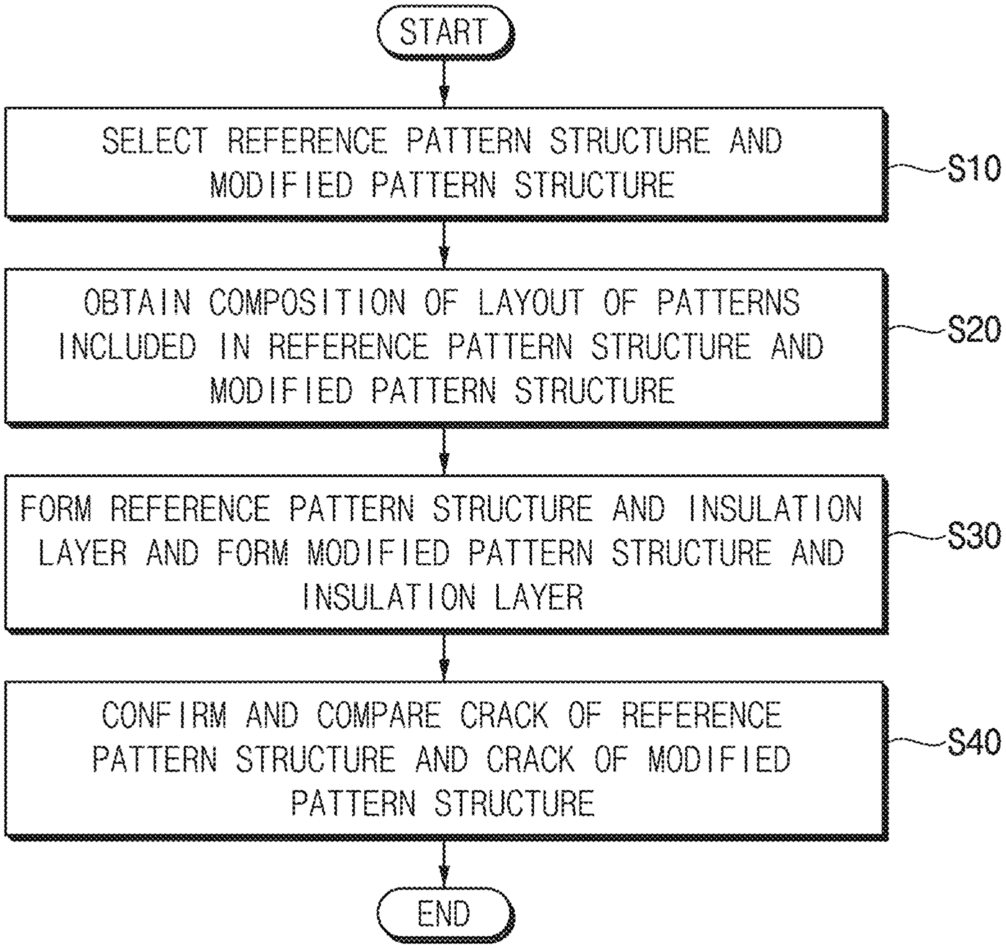
FIG. 6 is a flowchart illustrating a method of testing a crack of a pattern structure in accordance with example embodiments.
Figure 7:
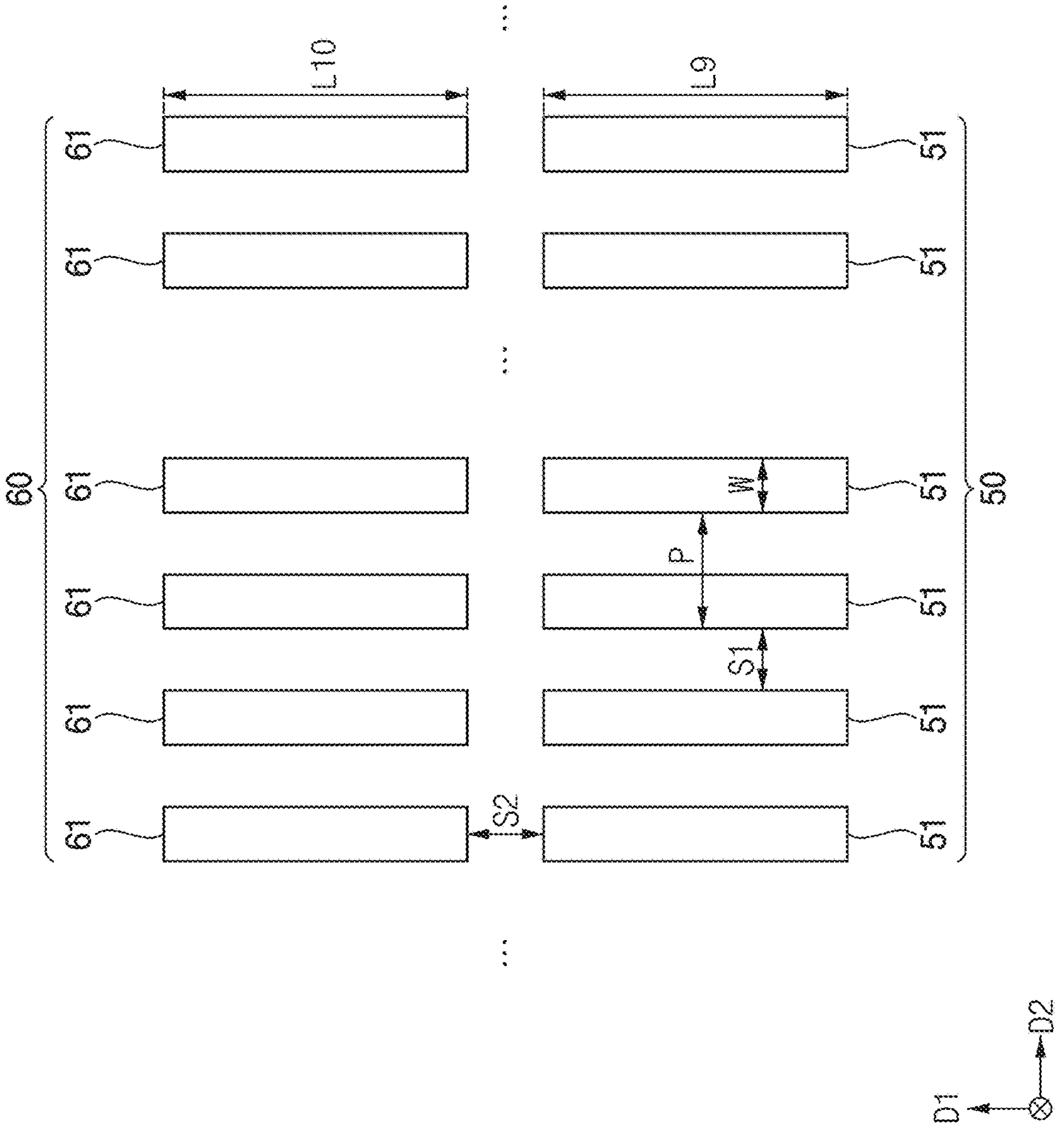
FIG. 7 is a plan view illustrating a layout of a reference pattern structure.

FIG. 6 is a flowchart illustrating a method of testing a crack in a pattern structure in accordance with example embodiments. FIG. 7 is a plan view illustrating a layout of a reference pattern structure.

Referring to FIGS. 1, 6, and 7, in step S10, a reference pattern structure and a modified pattern structure, which may be modified from the reference pattern structure, may be selected.

According to an example embodiment, the modified pattern structure may have a layout of FIG. 1. In some examples, the modified pattern structure may also have layouts of FIGS. 2 to 4. Hereinafter, for the convenience of explanation, only the case in which the modified pattern structure has the layout of FIG. 1 is illustrated.

As shown in FIG. 7, the reference pattern structure may include third and fourth pattern groups 50 and 60. The third pattern group 50 may include ninth patterns 51 and the fourth pattern group 60 may include tenth patterns 61.

In some example embodiments, each of the ninth and tenth patterns 51 and 61 may extend in the first direction D1 and the ninth and tenth patterns 51 and 61 may have ninth and tenth lengths L9 and L10, respectively, in the first direction D1. The ninth length L9 may be substantially equal to or different from the tenth length L10. The ninth and tenth patterns 51 and 61 may have the width W in the second direction D2.

The ninth patterns 51 may be spaced apart from each other in the second direction D2 by the first distance S1 and the tenth patterns 61 may be spaced apart from each other in the second direction D2 by the first distance S1. Thus, the pitch P of the ninth patterns 51 in the second direction D2 may be substantially equal to the pitch P of the tenth patterns 61 in the second direction D2. Hereinafter, a space between the ninth patterns 51 and a space between the tenth patterns 61 may be referred to as the first space. That is, the first spaces may have a constant length in the second direction D2.

Corresponding end portions in the first direction D1 of the ninth patterns 51 may be aligned with each other in the second direction D2 and corresponding end portions in the first direction D1 of the tenth patterns 61 may be aligned with each other in the second direction D2. Additionally, the ninth and tenth patterns 51 and 61 may be aligned with each other in the first direction D1, and may be spaced apart from each other by the second distance S2. That is, end portions of the ninth and tenth patterns 51 and 61 facing each other may be spaced apart from each other by the second distance S2 in the first direction D1.

In step S20, sizes of the patterns included in the reference pattern structure and the modified pattern structure may be changed to have various layouts.

In some embodiments, widths of the patterns and distances between the patterns included in the reference pattern structure and the modified pattern structure may be changed to have various layouts.

For example, the width W of the first to fourth patterns 11, 12, 21, and 22 shown in FIG. 1, the width W1 of the ninth and tenth patterns 51 and 61 shown in FIG. 7, the first distance S1 between the first and second patterns 11 and 12, between the third and fourth patterns 21 and 22, between the ninth patterns 51, and between the tenth patterns 61 may be changed to have layouts of the reference pattern structure and the modified pattern structure. Additionally, the second distance S2 between the first and third patterns 11 and 21 and the ninth and tenth patterns 51 and 61, and the third distance S3 between the second and fourth patterns 12 and 22 may be changed to have layouts of the reference pattern structure and the modified pattern structure.

In step S30, the reference pattern structure and an insulation layer surrounding the reference pattern structure may be formed on a substrate 100. Additionally, the modified pattern structure and an insulation layer surrounding the modified pattern structure may be formed on a substrate 100.

Referring to FIGS. 1, 6, and 7 together with FIG. 5, in example embodiments, the insulation layer 40 may be formed on the substrate 100, the insulation layer 40 may be partially etched to form openings through the insulation layer 40. A barrier layer may be formed on sidewalls and lower surfaces of the openings and an upper surface of the insulation layer 40. A conductive layer may be formed on the barrier layer to fill the openings and the conductive layer and the barrier layer may be planarized until the upper surface of the insulation layer 40 is exposed.

Thus, a pattern including the conductive pattern 32 and the barrier pattern 34 covering a sidewall and a lower surface of the conductive pattern 32 may be formed in each of the openings. The modified pattern structure including the patterns may be formed on the substrate 100.

The above processes may be performed on the reference pattern structure as well as the modified pattern structure. Additionally, the above processes may be performed on the reference pattern structure and the modified pattern structure having the various layouts in step S20.

In some embodiments, the conductive pattern 32 may include a metal, e.g., tungsten, copper, aluminum, etc. In some cases, the barrier pattern 34 may include a material having a low adhesion with respect to the conductive pattern 32 and/or the insulation layer 40 to be easily separated therefrom, e.g., a metal nitride such as titanium nitride. The insulation layer 40 may include silicon oxide, e.g., TEOS an insulating nitride, e.g., silicon nitride, etc.

The process of forming the conductive layer may be performed at about 400° C. and as the temperature decreases after forming the conductive pattern 32, a volume of the conductive pattern 32 may decrease. Thus, the conductive pattern 32 including a metal and the insulation layer 40 including an insulating material may be separated from each other due to a difference between coefficients of thermal expansion of the conductive pattern 32 and the insulation layer 40.

The barrier pattern 34 between the conductive pattern 32 and the insulation layer 40 may include a low adhesion with respect to the conductive pattern 32 and the insulation layer 40 Thus, as the temperature decreases, the separation of the conductive pattern 32 and the insulation layer 40 may not be prevented. When the separation occurs, a strain energy between the conductive pattern 32, the barrier pattern 34, and the insulation layer 40 may be converted into a kinetic energy to apply impact on the pattern structure so that a crack may occur in the pattern structure.

In step S40, cracks of the reference pattern structure and the modified pattern structure may be confirmed and compared to each other.

In some embodiments, the cracks of the reference pattern structure and the modified pattern structure having the various layouts (as described in step S20) may be confirmed and compared to each other.

According to an example embodiment, a scanning electron microscope (SEM) photo or a transmission electron microscope (TEM) photo may be taken at a boundary between the reference pattern structure and the insulation layer to confirm the crack of the reference pattern structure. Similarly, a SEM photo or a TEM photo may be taken at a boundary between the modified pattern structure and the insulation layer to confirm the crack of the modified pattern structure.

A scanning electron microscope (SEM) is a subset of electron microscopes that produces images of a sample by scanning the surface with a focused beam of electrons of relatively low energy as an electron probe that is scanned in a regular manner over the specimen. The electrons interact with atoms in the sample, producing various signals that contain information about the surface topography and composition of the sample.

A transmission electron microscopy (TEM) refers to a technique comprising a beam of electrons that is transmitted through a specimen to form an image. In some cases, TEM is performed for specimens having a thickness of less than 100 nm. An image is formed from the interaction of the electrons with the sample as the beam is transmitted through the specimen. The image is then magnified and focused onto an imaging device.

The crack of the reference pattern structure and the crack of the modified pattern structure may be compared to each other. Accordingly, if an amount of crack of the modified pattern structure is less than an amount of crack of the reference pattern structure at a certain layout or a general layout, then the reference pattern structure may be replaced with the modified pattern structure. That is, the modified pattern structure may be selected as a new reference pattern structure.

If the modified pattern structure for replacing the reference pattern structure in which a large amount of crack occurs is developed, the steps S10, S20, S30, and S40 may be used for testing whether the amount of crack in the modified pattern structure is less than the amount of crack in the reference pattern structure.

Figure 10:
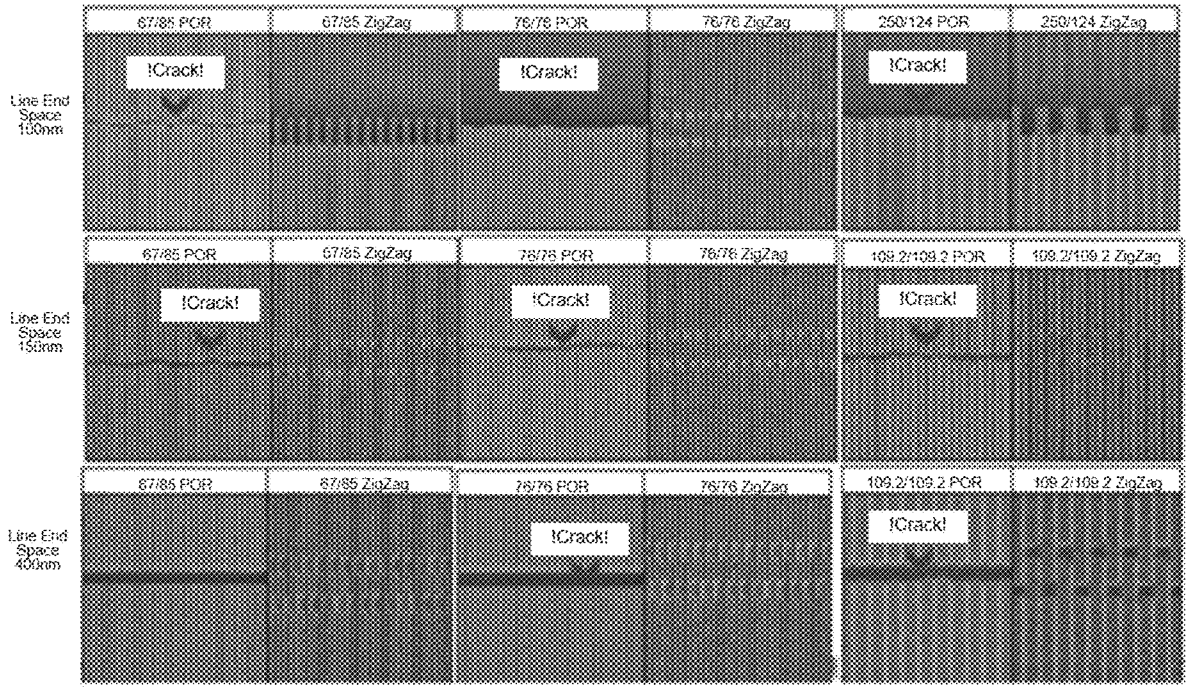
FIG. 10 shows SEM photos of the reference pattern structure (POR pattern) and an insulation layer surrounding the reference pattern structure, and SEM photos of the modified pattern structure (zigzag pattern) and an insulation layer surrounding the modified pattern structure.

FIG. 8 is a table showing a region (dark region) in which cracks occur and a region (light region) in which no cracks occur in the reference pattern structure having various layouts. FIG. 9 is a table showing a region (dark region) in which cracks occur and a region (light region) in which no cracks occur in the modified pattern structure having various layouts. FIG. 10 shows SEM photos of the reference pattern structure (POR pattern) and an insulation layer surrounding the reference pattern structure, and SEM photos of the modified pattern structure (zigzag pattern) and an insulation layer surrounding the modified pattern structure.

In FIGS. 8 and 9, 'End Space' represents the second distance S2 between the patterns in the second direction D2. Pitch represents a width W of each pattern and the first distance S1 between the patterns in the first direction D1. The width W and the first distance S1 are differentiated using a slash "(/)." The third space S3 may be substantially equal to the second distance S2 in the modified pattern structure.

Referring to FIGS. 8 to 10, in the reference pattern structure, when the second distance S2 is equal to or less than about 400 nm, cracks generally occur, and when the second distance S2 is equal to or more than about 450 nm, no cracks occur at the width W of equal to or less than about 150 nm.

In the modified pattern structure, even when the second distance S2 is equal to or less than about 400 nm, no cracks occur at the width W of equal to or less than about 300 nm.

Thus, an amount of crack of the modified pattern structure is less than an amount of crack of the reference pattern structure in various layouts, so that the reference pattern structure may be replaced with the modified pattern structure, and the modified pattern structure may be selected as a new reference pattern structure.

Figure 11:
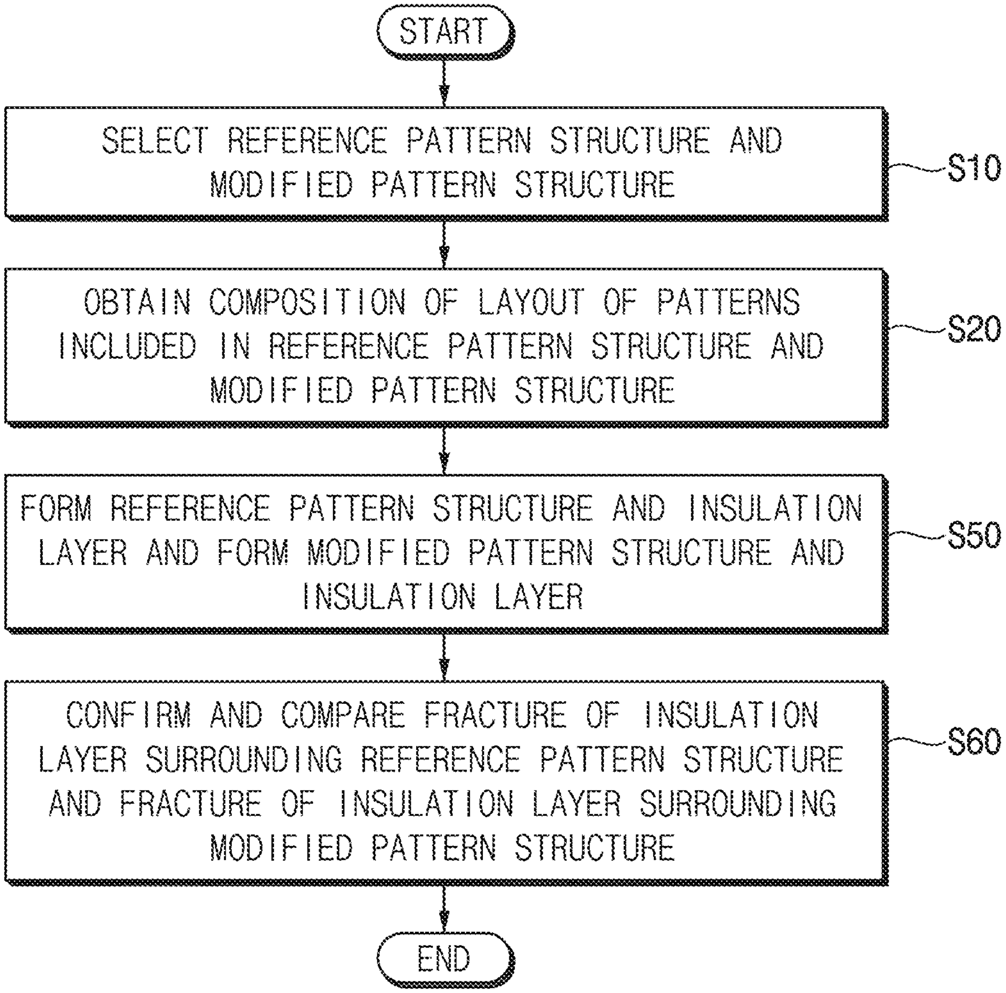
FIG. 11 is a flowchart illustrating a method of testing a fracture of an insulation layer surrounding a pattern structure in accordance with example embodiments.

FIG. 11 is a flowchart illustrating a method of testing fracture of an insulation layer surrounding a pattern structure in accordance with example embodiments. The method of testing facture of the insulation layer may include processes that are substantially the same as or similar to those illustrated with reference to FIGS. 6 to 10, and thus repeated explanations are omitted herein.

A reference pattern structure and a modified pattern structure may be substantially the same as the reference pattern structure and the modified pattern structure, respectively, that may be used in the method of testing the crack thereof.

Referring to FIG. 11, in step S10, the reference pattern structure and the modified pattern structure (i.e., modified from the reference pattern structure) may be selected.

In step S20, sizes of the patterns included in the reference pattern structure and the modified pattern structure may be changed to have various layouts.

In step S50, the reference pattern structure and the insulation layer 40 surrounding the reference pattern structure may be formed on the substrate 100, and the modified pattern structure and the insulation layer 40 surrounding the modified pattern structure may be formed on the substrate 100.

In some examples, the conductive pattern 32 may include a metal, e.g., tungsten, copper, aluminum, etc. The barrier pattern 34 may include a material having a high adhesion with respect to the conductive pattern 32 and/or the insulation layer 40 so as not to be easily separated therefrom. In some examples, the barrier pattern 34 may have a multi-layered structure of a metal layer including a metal, e.g., titanium and a metal nitride layer include a metal nitride, e.g., titanium nitride. The insulation layer 40 may include silicon oxide, e.g., TEOS, an insulating nitride, e.g., silicon nitride, etc.

As the temperature decreases, a volume of the conductive pattern 32 may decrease. Accordingly, the conductive pattern 32 and the insulation layer 40 may be separated from each other due to difference between coefficients of thermal expansion of the conductive pattern 32 and the insulation layer 40. In some cases, the barrier pattern 34 disposed between the conductive pattern 32 and the insulation layer 40 may include the material having the high adhesion with respect to the conductive pattern 32 and/or the insulation layer 40, so that the separation of the conductive pattern 32 and the insulation layer 40 due to the decrease of the temperature may be reduced or prevented. Accordingly, no cracks may occur at a boundary between the conductive pattern 32 and the insulation layer 40.

However, if a strain energy between the conductive pattern 32, the barrier pattern 34, and the insulation layer 40 exceeds a limit of fracture of the insulation layer 40, the insulation layer 40 may be broken instead of the crack in the reference pattern structure and the modified pattern structure.

In step S60, the fracture of the insulation layer 40 surrounding the reference pattern structure and the fracture of the insulation layer 40 surrounding the modified pattern structure may be confirmed and compared to each other.

In some cases, the fracture of the insulation layer 40 of the reference pattern structure in various layouts of step S50 and the fracture of the insulation layer 40 of the modified pattern structure in various layouts of step S50 may be confirmed, and compared to each other.

In an example embodiment, the fractures of the insulation layers may be confirmed using SEM photos or TEM photos.

The fracture of the insulation layer 40 surrounding the reference pattern structure and the fracture of the insulation layer 40 surrounding the modified pattern structure may be compared to each other. Accordingly, if an amount of fracture of the insulation layer 40 surrounding the modified pattern structure is less than an amount of fracture of the insulation layer 40 surrounding the reference pattern structure at a certain layout or a general layout, then the reference pattern structure may be replaced with the modified pattern structure. That is, the modified pattern structure may be selected as a new reference pattern structure.

If the modified pattern structure for replacing the reference pattern structure in which a large amount of fracture occurs is developed, the steps S10, S20, S50 and S60 may be used for testing whether the amount of fracture in the insulation layer 40 surrounding the modified pattern structure is less than the amount of fracture in the insulation layer 40 surrounding the reference pattern structure.

Figure 12:
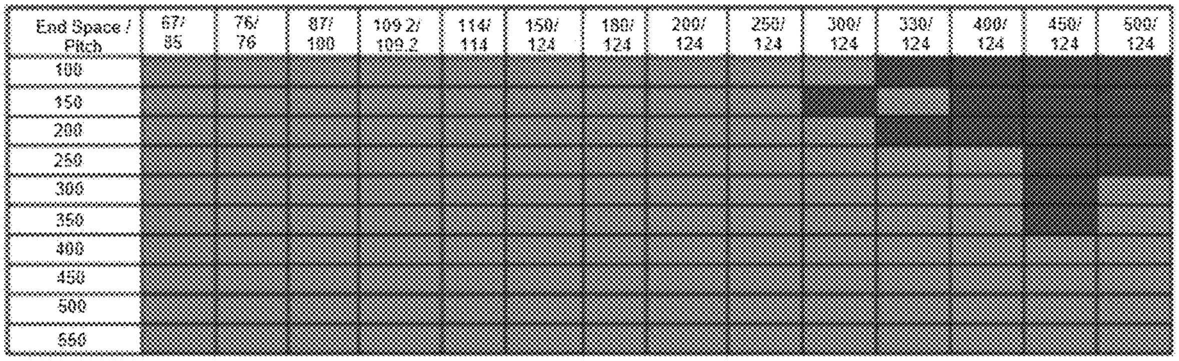
FIG. 12 is a table showing a region (dark region) in which fractures occur and a region (light region) in which no fractures occur in the insulation layer surrounding the reference pattern structure having various layouts.
Figure 13:
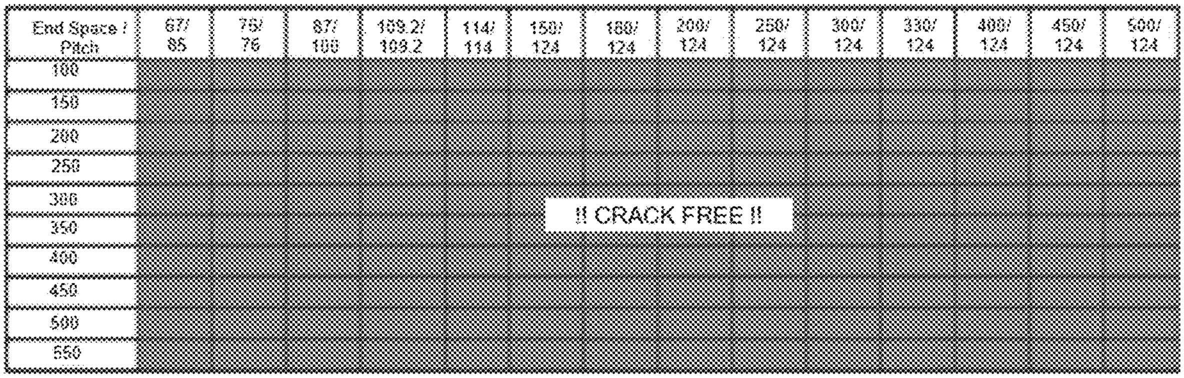
FIG. 13 is a table showing a region (dark region) in which fractures occur and a region (light region) in which no fractures occur in the insulation layer surrounding the modified pattern structure having various layouts.
Figure 14:
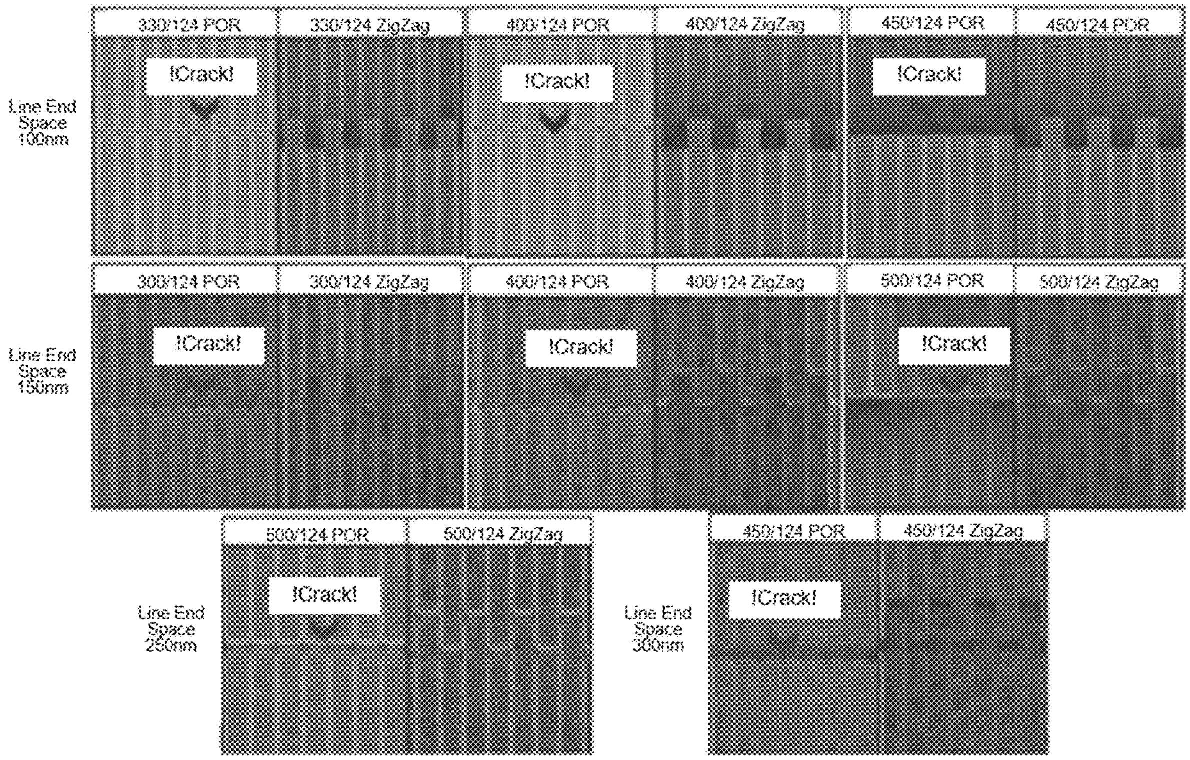
FIG. 14 shows SEM photos of the reference pattern structure (POR Pattern) and the insulation layer surrounding the reference pattern structure, and SEM photos of the modified pattern structure (zigzag pattern) and the insulation layer surrounding the modified pattern structure.

FIG. 12 is a table showing a region (dark region) in which fractures occur and a region (light region) in which no fractures occur in the insulation layer surrounding the reference pattern structure having various layouts. FIG. 13 is a table showing a region (dark region) in which fractures occur and a region (light region) in which no fractures occur in the insulation layer surrounding the modified pattern structure having various layouts. FIG. 14 shows SEM photos of the reference pattern structure (POR pattern) and the insulation layer surrounding the reference pattern structure, and SEM photos of the modified pattern structure (zigzag pattern) and the insulation layer surrounding the modified pattern structure.

Component numbers in FIGS. 12 and 13 may correspond to the component numbers of FIGS. 7 and 8.

Referring to FIGS. 2 to 14, in the insulation layer surrounding the reference pattern structure, when the second distance S2 is equal to or less than about 350 nm, fractures generally occur at the width W of equal to or less than about 300, while in the insulation layer surrounding the modified pattern structure, no fractures occur.

Thus, an amount of fracture of the insulation layer surrounding the modified pattern structure is less than an amount of fracture of the insulation layer surrounding the reference pattern structure in various layouts, so that the reference pattern structure may be replaced with the modified pattern structure, and the modified pattern structure may be selected as a new reference pattern structure.

Figure 15:
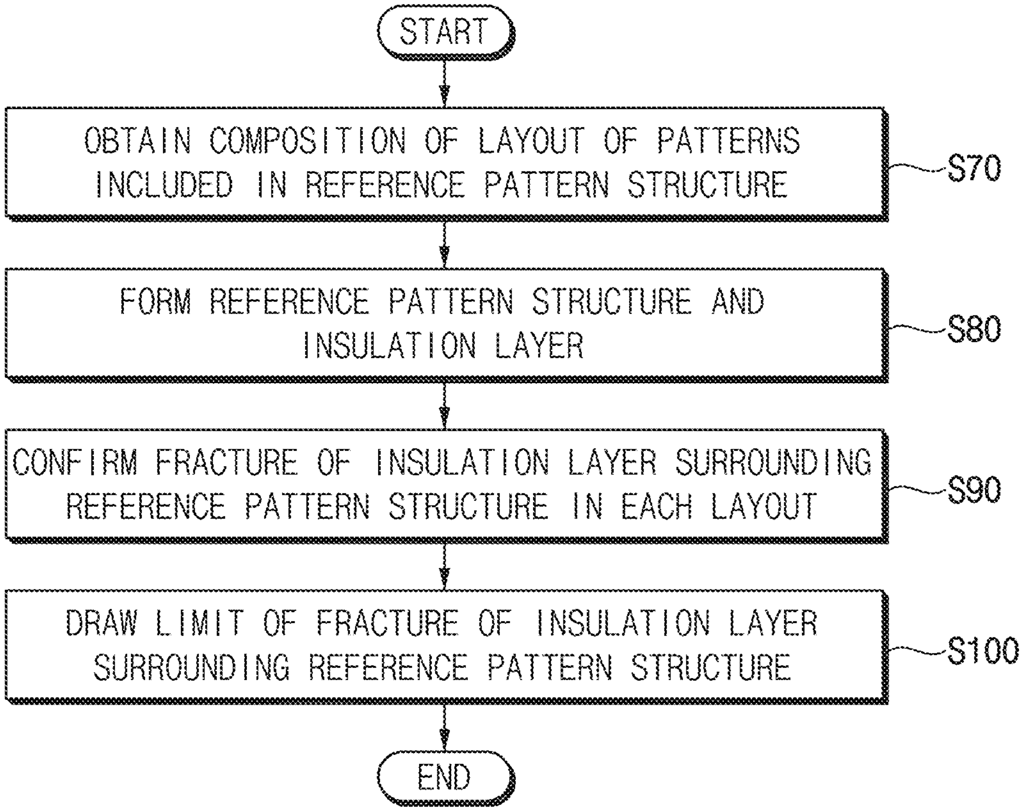
FIG. 15 is a flowchart illustrating a method of testing fracture of an insulation layer surrounding a pattern structure in accordance with example embodiments.

FIG. 15 is a flowchart illustrating a method of testing a fracture of an insulation layer surrounding a pattern structure in accordance with example embodiments. The method of testing a fracture of the insulation layer may include processes substantially the same as or similar to those illustrated with reference to FIGS. 11 to 14, and thus repeated explanations are omitted herein.

Referring to FIG. 15, in step S70, sizes of the patterns included in the reference pattern structure and the modified pattern structure may be changed to have various layouts.

In step S80, the reference pattern structure and the insulation layer 40 surrounding the reference pattern structure may be formed on the substrate 100.

In some examples, the conductive pattern 32 may include a metal, e.g., tungsten, copper, aluminum, etc. The barrier pattern 34 may include a material having a high adhesion with respect to the conductive pattern 32 and/or the insulation layer 40 so as not to be easily separated therefrom. In an example embodiment, the barrier pattern 34 may have a multi-layered structure of a metal layer including a metal, e.g., titanium and a metal nitride layer include a metal nitride, e.g., titanium nitride. The insulation layer 40 may include silicon oxide (e.g., TEOS), an insulating nitride (e.g., silicon nitride), etc.

As the temperature decreases, a volume of the conductive pattern 32 may decrease. Accordingly, the conductive pattern 32 and the insulation layer 40 may be separated from each other due to difference between coefficients of thermal expansion of the conductive pattern 32 and the insulation layer 40. However, the barrier pattern 34 disposed between the conductive pattern 32 and the insulation layer 40 may include the material having high adhesion with respect to the conductive pattern 32 and/or the insulation layer 40, such that the separation of the conductive pattern 32 and the insulation layer 40 due to the decrease of the temperature may be reduced or prevented. Accordingly, no cracks may occur at a boundary between the conductive pattern 32 and the insulation layer 40.

However, if a strain energy between the conductive pattern 32, the barrier pattern 34 and the insulation layer 40 exceeds a limit of fracture of the insulation layer 40, the insulation layer 40 may be broken instead of the crack in the reference pattern structure and the modified pattern structure.

In step S90, the fracture of the insulation layer 40 surrounding the reference pattern structure in various layouts may be confirmed.

In step S100, a limit of fracture of the insulation layer 40 surrounding the reference pattern structure may be drawn.

That is, by confirming the layouts of the reference pattern structure when the fracture of the insulation layer 40 surrounding the reference pattern structure occurs, conditions of the reference pattern structure under which the fracture occurs, e.g., widths of patterns, distances between patterns in the reference pattern structure may be confirmed.

According to an embodiment, the steps S70, S80, S90, and S100 may be used to test a certain material of the insulation layer 40 in which less fracture may occur.

That is, the insulation layer 40 surrounding the reference pattern structure and including a new material may be formed. Additionally, the steps S70, S80, S90, and S100 may be performed to draw the limit of fracture of the insulation layer 40. The limit of fracture thus obtained may be compared to a limit of fracture of the insulation layer 40 surrounding the reference pattern structure and including a conventional material. If the limit of fracture of the insulation layer 40 including the new material is greater than the limit of fracture of the insulation layer 40 including the conventional material, (i.e., if a range of layouts in which the fracture occurs is relatively small) the insulation layer 40 including the conventional material may be replaced with the insulation layer 40 including the new material.

The pattern structure in accordance with example embodiments may be applied to logic devices (e.g., CPUs, MPUs, APs, etc.), volatile memory devices (e.g., SRAMs, DRAMs, etc.), and non-volatile memory devices (e.g., flash memory devices, PRAMs, MRAMs, RRAMs, etc.). The method of testing a crack of the pattern structure and the method of testing a fracture of the insulation layer surrounding the pattern structure may be used for pattern structures and insulation layers included in the above devices.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

The processes discussed above are intended to be illustrative and not limiting. One skilled in the art would appreciate that the steps of the processes discussed herein may be omitted, modified, combined, and/or rearranged, and any additional steps may be performed without departing from the scope of the invention. More generally, the above disclosure is meant to be exemplary and not limiting. Only the claims that follow are meant to set bounds as to what the present invention includes. Furthermore, it should be noted that the features and limitations described in any one embodiment may be applied to any other embodiment herein, and flowcharts or examples relating to one embodiment may be combined with any other embodiment in a suitable manner, done in different orders, or done in parallel.

In addition, the systems and methods described herein may be performed in real time. It should also be noted, the systems and/or methods described above may be applied to, or used in accordance with, other systems and/or methods.

What is claimed is:

1. A pattern structure comprising:

a plurality of first patterns disposed on a substrate, extending in a first direction, and spaced apart from each other in a second direction, wherein the first direction and the second direction are parallel to an upper surface of the substrate and perpendicular to each other;

a plurality of second patterns disposed on the substrate, extending in the first direction, and spaced apart from each other in the second direction;

wherein the plurality of first patterns are aligned with each other in the second direction at a first end and the plurality of second patterns are aligned with each other in the second direction at a second end that is opposite to the first end in the first direction;

wherein the plurality of second patterns are aligned with and spaced apart from the plurality of first patterns, respectively, in the first direction to form a plurality of spaces arranged in a zigzag pattern in the second direction;

wherein each of the plurality of spaces is located between a first pattern of the plurality of first patterns and a second pattern of the plurality of second patterns that is aligned with the first pattern in the first direction; and wherein each pair of adjacent spaces from the plurality of spaces comprises a first space and a second space that is separated from the first space in the first direction.

2. The pattern structure according to claim 1, wherein a top edge of a pattern of the plurality of first patterns extends above a bottom edge of an adjacent pattern of the plurality of second patterns in the first direction.

3. The pattern structure according to claim 1, wherein the plurality of first patterns comprises a plurality of third patterns and a plurality of fourth patterns alternately arranged with the plurality of third patterns in the second direction, wherein each of the plurality of third patterns has a first length in the first direction and each of the plurality of fourth patterns has a second length in the first direction that is greater than the first length.

4. The pattern structure according to claim 3, wherein the plurality of second patterns comprises a plurality of fifth patterns and a plurality of sixth patterns alternately arranged with the plurality of fifth patterns in the second direction, wherein each of the plurality of fifth patterns has a third length in the first direction and each of the plurality of sixth patterns has a fourth length in the first direction that is greater than the third length; and wherein the plurality of fifth patterns and the plurality of sixth patterns are aligned with the plurality of third patterns and the plurality of fourth patterns, respectively, in the first direction.

5. The pattern structure according to claim 1, wherein the plurality of first patterns comprises a plurality of third patterns having a first length in the first direction, a plurality of fourth patterns having a second length in the first direction greater than the first length, and a plurality of fifth patterns having a third length in the first direction greater than the second length; and wherein the plurality of third patterns, the plurality of fourth patterns, and the plurality of fifth patterns are arranged in the second direction according to an order comprising a pattern of the plurality of third patterns, a pattern of the plurality of fourth patterns, a pattern of the plurality of fifth patterns, a subsequent pattern of the plurality of fourth patterns, and a subsequent pattern of the plurality of third patterns.

6. The pattern structure according to claim 5, wherein the plurality of second patterns comprises a plurality of sixth patterns having a fourth length in the first direction, a plurality of seventh patterns having a fifth length in the first direction less than the fourth length, and a plurality of eighth patterns having a sixth length in the first direction less than the fifth length; and wherein the plurality of sixth patterns, the plurality of seventh patterns, and the plurality of eighth patterns are aligned with the plurality of third patterns, the plurality of fourth patterns, and the plurality of fifth patterns, respectively, in the first direction, and are arranged in the second direction according to an order comprising a pattern of the plurality of sixth patterns, a pattern of the plurality of seventh patterns, a pattern of the plurality of eighth patterns, a subsequent pattern of the plurality of seventh patterns, and a subsequent pattern of the plurality of sixth patterns.

7. The pattern structure according to claim 1, wherein each of the plurality of spaces have the same length in the first direction.

8. The pattern structure according to claim 1, wherein each of the plurality of first patterns and each of the plurality of second patterns have the same width in the second direction.

9. The pattern structure according to claim 1, wherein a distance between each of the plurality of first patterns and a distance between each of the plurality of second patterns are equal to each other.

10. The pattern structure according to claim 1, wherein each of the plurality of first patterns and each of the plurality of second patterns comprises:

a conductive pattern comprising a metal; and a barrier pattern surrounding the conductive pattern and comprising a metal nitride.

11. The pattern structure according to claim 10, wherein the barrier pattern has a multi-layered structure of a metal layer comprising a metal and a metal nitride layer comprising a metal nitride.

12. A pattern structure comprising:

a first pattern group including a plurality of first patterns, a plurality of second patterns, and a plurality of third patterns disposed on a substrate, extending in a first direction, and spaced apart from each other in a second direction, wherein the first direction and the second direction are parallel to an upper surface of the substrate and perpendicular to each other;

a second pattern group including a plurality of fourth patterns, a plurality of fifth patterns, and a plurality of sixth patterns disposed on the substrate, extending in the first direction, and spaced apart from each other in the second direction;

wherein the plurality of first patterns, the plurality of second patterns, and the plurality of third patterns are arranged in the second direction according to an order comprising a pattern of the plurality of first patterns, a pattern of the plurality of second patterns, a pattern of the plurality of third patterns, a subsequent pattern of the plurality of second patterns, and a subsequent pattern of the plurality of first patterns;

wherein the plurality of fourth patterns, the plurality of fifth patterns, and the plurality of sixth patterns are aligned with the plurality of first patterns, the plurality of second patterns, and the plurality of third patterns, respectively, in the first direction;

wherein the plurality of fourth patterns, the plurality of fifth patterns, and the plurality of sixth patterns are arranged in the second direction according to an order comprising a pattern of the plurality of fourth patterns, a pattern of the plurality of fifth patterns, a pattern of the plurality of sixth patterns, a subsequent pattern of the plurality of fifth patterns, and a subsequent pattern of the plurality of fourth patterns;

wherein a plurality of spaces are located between a first pattern of the plurality of first patterns and a fourth pattern of the plurality of fourth patterns, between a second pattern of the plurality of second patterns and a fifth pattern of the plurality of fifth patterns, and between a third pattern of the plurality of third patterns and a sixth pattern of the plurality of sixth patterns; and wherein each of adjacent spaces from the plurality of spaces comprises a first space, a second space, and a third space that are separated from each other in the first direction.

13. The pattern structure according to claim 12, wherein a top edge of a pattern of the plurality of second patterns extends above a bottom edge of an adjacent pattern of the plurality of fourth patterns in the first direction; and wherein a top edge of a pattern of the plurality of third patterns extends above a bottom edge of an adjacent pattern of the plurality of fifth patterns in the first direction.

14. The pattern structure according to claim 12, wherein each of the first space, the second space, and the third space have the same length in the first direction.

15. The pattern structure according to claim 12, wherein each of the plurality of first patterns, the plurality of second patterns, the plurality of third patterns, the plurality of fourth patterns, the plurality of fifth patterns, and the plurality of sixth patterns have the same width in the second direction; and wherein a distance between the plurality of first patterns, the plurality of second patterns, and the plurality of third patterns and a distance between the plurality of fourth patterns, the plurality of fifth patterns, and the plurality of sixth patterns are equal to each other.

16. A semiconductor device comprising:

a pattern structure comprising:

a plurality of first patterns disposed on a substrate, extending in a first direction, and spaced apart from each other in a second direction, wherein the first direction and the second direction are parallel to an upper surface of the substrate and perpendicular to each other; and a plurality of second patterns disposed on the substrate, extending in the first direction, and spaced apart from each other in the second direction; and an insulation layer disposed on the substrate and surrounding the pattern structures;

wherein the plurality of second patterns are aligned with and spaced apart from the plurality of first patterns, respectively, in the first direction to form a plurality of spaces;

wherein the insulation layer is disposed between the plurality of first patterns and the plurality of second patterns to form a plurality of first portions, respectively, and adjacent first portions of the insulation layer comprise a first space and a second space that is separated from the first space in the first direction;

wherein each of the plurality of the first patterns and the plurality of the second patterns comprises:

a conductive pattern comprising a metal; and a barrier pattern surrounding the conductive pattern and comprising a metal nitride, the barrier pattern has a multi-layered structure of a metal layer comprising a metal and a metal nitride layer comprising a metal nitride; and the insulation layer comprises silicon oxide.

17. The pattern structure according to claim 16, wherein a top edge of a pattern of the plurality of first patterns extends above a bottom edge of an adjacent pattern of the plurality of second patterns in the first direction.

18. The pattern structure according to claim 16, wherein the plurality of first portions of the insulation layer are arranged in a zigzag pattern in the second direction.

19. The pattern structure according to claim 16, wherein the insulation layer is configured to prevent a mold in a VNAND flash memory device from collapsing.

* * * * *